(12) United States Patent
Shi et al.

(10) Patent No.: US 12,506,048 B2
(45) Date of Patent: Dec. 23, 2025

(54) BIFACIAL SEMICONDUCTOR WAFER

(71) Applicant: Sandisk Technologies, Inc., Milpitas, CA (US)

(72) Inventors: Lei Shi, Shanghai (CN); Cong Zhang, Shanghai (CN); Chin-Tien Chiu, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 691 days.

(21) Appl. No.: 17/888,845

(22) Filed: Aug. 16, 2022

(65) Prior Publication Data

US 2024/0063092 A1 Feb. 22, 2024

(51) Int. Cl.
*H01L 23/48* (2006.01)
*H01L 23/00* (2006.01)

(52) U.S. Cl.
CPC ............ *H01L 23/481* (2013.01); *H01L 24/02* (2013.01); *H01L 2224/02331* (2013.01); *H01L 2224/02372* (2013.01); *H01L 2224/02373* (2013.01)

(58) Field of Classification Search
CPC .............................. H01L 23/481; H01L 24/02
See application file for complete search history.

(56) References Cited

U.S. PATENT DOCUMENTS

| 11,289,453 B2 * | 3/2022 | Patil ................. H01L 23/49838 |
| 2009/0239332 A1 | 9/2009 | Fork et al. |
| 2011/0186998 A1 * | 8/2011 | Wu .................... H01L 23/49827 257/738 |
| 2017/0186730 A1 | 6/2017 | Shen et al. |
| 2022/0071005 A1 | 3/2022 | Lim et al. |

FOREIGN PATENT DOCUMENTS

| KR | 20110131702 A | 12/2011 |
| KR | 20140117891 A | 10/2014 |

* cited by examiner

*Primary Examiner* — Douglas M Menz
(74) *Attorney, Agent, or Firm* — DENTONS Durham Jones Pinegar (57) ABSTRACT

A semiconductor device having one or more bifacial semiconductor wafers. The bifacial semiconductor wafer includes a first array of semiconductor dies on a first planar surface and a second array of semiconductor dies on a second planar surface that is opposite the first planar surface. The first array of semiconductor dies are electrically coupled via a first redistribution layer and the second array of semiconductor dies are electrically coupled via a second redistribution layer. One or more through silicon vias electrically couple the first array of semiconductor dies with the second array of semiconductor dies.

15 Claims, 7 Drawing Sheets

BIFACIAL SEMICONDUCTOR WAFER

BACKGROUND

In a traditional high capacity memory device, such as, for example, a three dimensional (3D) NAND memory device, semiconductor dies are vertically stacked on top of one another. In order to facilitate communication between different semiconductor dies, edges of the stacked semiconductor dies are often offset from one another. A bond wire is used to connect a bond pad of one semiconductor die in the stack of semiconductor dies to a bond pad of another semiconductor die in the stack.

In order to increase the storage capacity of a high capacity memory device, additional semiconductor dies may be added to the stack. However, current high capacity memory devices are limited in the number of semiconductor dies that can be included in the stack. For example, as additional semiconductor dies are added, the overall size of the high capacity memory device increases and consumes more space, wire bonding becomes more difficult, and the semiconductor die may be subject to warpage, die tilt or other manufacturing issues.

Accordingly, it would be advantageous to increase the storage capacity of a memory device while maintaining or reducing the size of the memory device and avoiding the other manufacturing issues outlined above.

SUMMARY

The present application describes a semiconductor device that includes a number of vertically stacked semiconductor wafers. In the examples described herein, the semiconductor wafers are bifacial. For example, a first surface, or face, of the semiconductor wafer includes a first circuit layer. A second surface, or face, of the semiconductor wafer includes a second circuit layer. In an example, the first circuit layer and the second circuit layer may include storage circuitry and/or signal transmission circuitry.

The bifacial semiconductor wafer of the present disclosure is described as having a first circuit layer on a first surface and a second circuit layer on a second surface. It should be understood that the first circuit layer and its associated second circuit layer comprise a bifacial semiconductor die. Further, it should be understood that the bifacial semiconductor wafer described herein may consist of a series of bifacial semiconductor dies. In an example, the bifacial semiconductor dies may be NAND memory dies.

The first circuit layer and the second circuit layer each include or are otherwise associated with a respective redistribution layer. The redistribution layer enables each semiconductor die on a particular surface of the bifacial semiconductor wafer to communicate with other semiconductor dies on that particular surface. For example, the redistribution layer on the first surface of the bifacial semiconductor wafer enables signals to be passed between each of the semiconductor dies on the first surface. Likewise, the redistribution layer on the second surface of the bifacial semiconductor wafer enables signals to be passed between each of the semiconductor dies on the second surface. One or more through silicon vias electrically couple the first circuit layer and the second circuit layer. For example, the through silicon vias electrically couple the semiconductor dies on the first surface with the semiconductor dies on the second surface.

Accordingly, the present application describes a semiconductor device that includes a bifacial semiconductor wafer having a first planar surface and a second planar surface opposite the first planar surface. A first plurality of semiconductor dies are provided on the first planar surface and a second plurality of semiconductor dies are provided on the second planar surface. A plurality of through silicon vias electrically couple the first plurality of semiconductor dies on the first planar surface with the second plurality of semiconductor dies on the second planar surface.

Also described is a semiconductor device that includes a first bifacial semiconductor wafer and a second bifacial semiconductor wafer. The first bifacial semiconductor wafer has a first circuit layer on a first planar surface and a second circuit layer on a second planar surface opposite the first planar surface. In an example, the first circuit layer is electrically coupled to the second circuit layer. The second bifacial semiconductor wafer is electrically coupled to the first bifacial semiconductor wafer. In an example, the second bifacial semiconductor wafer has a first circuit layer on a first planar surface and a second circuit layer on a second planar surface opposite the first planar surface. The first circuit layer of the second bifacial semiconductor wafer is electrically coupled to the second circuit layer of the first bifacial semiconductor wafer.

The present application also describes a method for fabricating a bifacial semiconductor wafer. In an example, the method includes fabricating a first plurality of semiconductor dies on a first planar surface of a first silicon wafer and fabricating a second plurality of semiconductor dies on a first planar surface of a second silicon wafer. A second planar surface of the first silicon wafer is bonded to a second planar surface of the second silicon wafer. In an example, the second planar surface of the first silicon wafer is opposite the first planar surface of the first silicon wafer and the second planar surface of the second silicon wafer is opposite the first planar surface of the second silicon wafer. The method also includes fabricating one or more through silicon vias through the first silicon wafer and the second silicon wafer to electrically couple the first plurality of semiconductor dies on the first planar surface of the first silicon wafer with the second plurality of semiconductor dies on the first planar surface of the second silicon wafer.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. Accordingly, examples may take the form of a hardware implementation, an entirely software implementation, or an implementation combining software and hardware aspects. The following detailed description is therefore not to be taken in a limiting sense, and the scope of the present disclosure is defined by the appended claims and their equivalents.

In traditional three dimensional (3D) NAND memory devices, a semiconductor wafer having an array of memory cells is vertically stacked on another semiconductor wafer having another array of memory cells. As the number of layers increases, the storage capacity of the memory device increases.

However, current 3D NAND memory devices are limited in the number of layers that can be stacked together. For example, as additional semiconductor wafers are added to the 3D NAND memory device, the overall size of the 3D NAND memory device increases. Additionally, as additional layers are added, manufacturing becomes more complex and costly (in terms of time and/or materials). Adding additional semiconductor wafers can also increase an amount of stress that is induced on the semiconductor wafers which can subsequently warp the semiconductor wafers. Warped semiconductor wafers can negatively impact the performance of the 3D NAND memory device.

In order to address the above, the present application describes a bifacial semiconductor wafer for use in 3D NAND memory devices. Although 3D NAND memory devices are specifically mentioned, the examples described herein may be used in various memory devices and/or other semiconductor devices.

The bifacial semiconductor wafer of the present disclosure includes a first planar surface, or face. A first circuit layer is provided on the first planar surface. The first circuit layer may comprise a first semiconductor die (e.g., memory die). The first planar surface of the bifacial semiconductor wafer may include a series or an array of semiconductor dies. The first circuit layer also includes or is otherwise associated with a redistribution layer (RDL). The redistribution layer enables communication between the various semiconductor dies on the first planar surface.

Likewise, the bifacial semiconductor wafer includes a second planar surface, or face, that is opposite the first planar surface. A second circuit layer is provided on the second planar surface. The second circuit layer may comprise a semiconductor die (e.g., memory die). Like the first planar surface, the second planar surface of the bifacial semiconductor wafer may include a series or an array of semiconductor dies. The second circuit layer also includes or is otherwise associated with a redistribution layer (RDL). The redistribution layer enables communication between the various semiconductor dies on the second planar surface. One or more through silicon vias (TSVs) facilitate signal transmission between the semiconductor dies on the first planar surface and the semiconductor dies on the second planar surface.

In some examples, multiple bifacial semiconductor wafers may be stacked on top of each other to create, for example, a high capacity memory device. For example, a first planar surface of a first bifacial semiconductor wafer may be coupled or bonded to a second planar surface of a second bifacial semiconductor wafer. In an example, the first bifacial semiconductor wafer and the second bifacial semiconductor wafer may be coupled or otherwise bonded together by various wafer to wafer bonding processes including, but not limited to, copper to copper bonding and/or via one or more solder bumps/balls. The wafer to wafer bonding process enables high speed signal transmission between the bifacial semiconductor wafers and eliminates the need for bonding the bifacial semiconductor wafers using bond wires.

The bifacial semiconductor wafer described herein also reduces the risk of wafer warpage when the bifacial semiconductor wafers are stacked on top of one another. For example, when the first circuit layer is fabricated on the first planar surface of the semiconductor wafer, stress is applied on the semiconductor wafer in a first direction. However, when the second circuit layer is fabricated and provided on the second planar surface of the semiconductor wafer, a similar or the same amount of stress is applied on the semiconductor wafer in a second direction that is opposite the first direction. The stress applied in the second direction effectively offsets the stress applied in the first direction thereby reducing the risk of wafer warpage.

Accordingly, the bifacial semiconductor wafer of the present disclosure provides many technical benefits including, but not limited to, effectively doubling the storage capacity of a memory device without significantly increasing the overall size of the package, reducing or minimizing the risk of wafer warpage when wafers are stacked together, high transmission speeds between bifacial semiconductor wafers due to the wafer to wafer bonding process, and reducing manufacturing costs in terms of time and materials.

These and other examples will be described in more detail with respect to FIG. 1—FIG. 8C.

Figure 1:
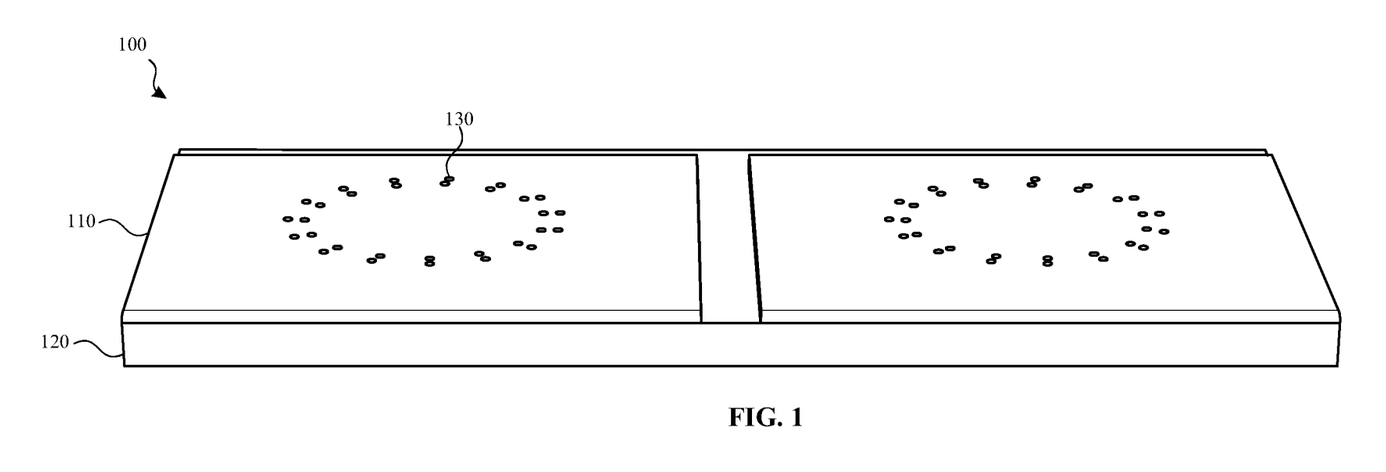
FIG. 1 illustrates traditional semiconductor dies that are used in a memory device, such as, for example, a three dimensional (3D) NAND memory device.

FIG. 1 illustrates traditional semiconductor dies 100 that are used in a memory device, such as, for example, a three dimensional (3D) NAND memory device. As shown in FIG. 1, the semiconductor wafer 100 includes a single circuit layer 110 provided on a base layer 120. In an example, the circuit layer 110 may comprise a semiconductor die. As briefly described above, in a traditional 3D NAND memory device, multiple semiconductor wafers 100 may be stacked on top of each other. In some examples, the semiconductor wafer 100 may include one or more through silicon vias 130 that mechanically and/or electrically connect the individual semiconductor wafers together. In other examples, a bond wire may electrically couple a bond pad on a first semiconductor wafer to a bond pad on a second semiconductor wafer.

Figure 2:
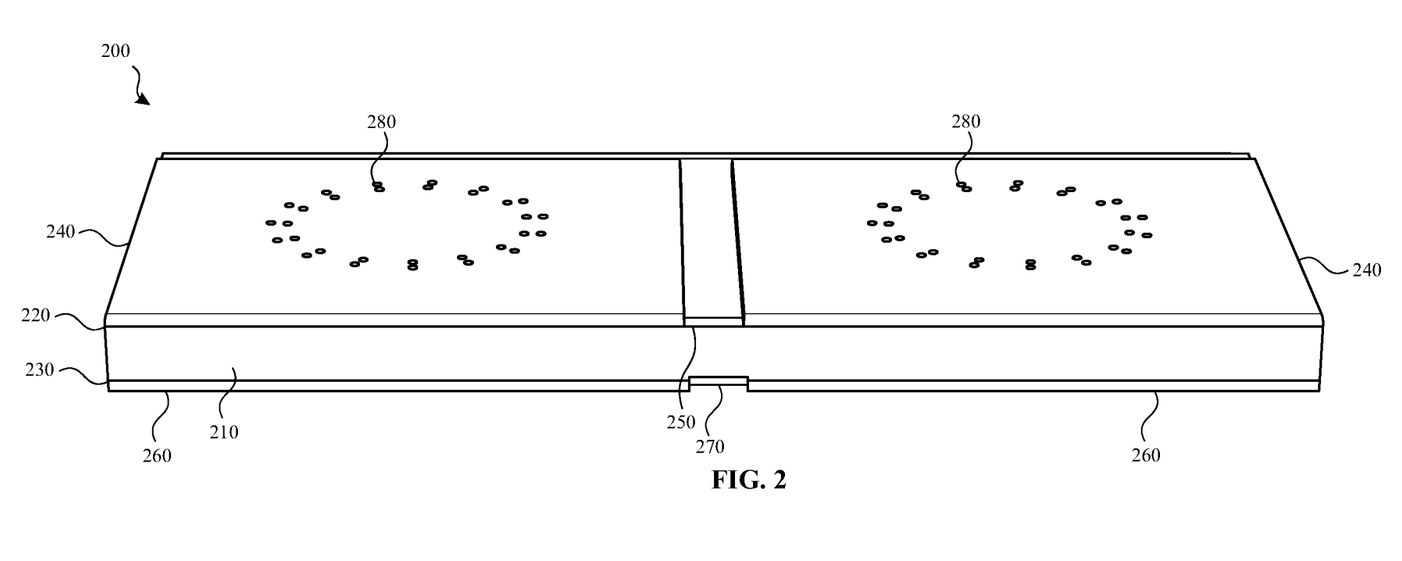
FIG. 2 illustrates a bifacial semiconductor wafer having semiconductor dies on opposing planar surfaces according to an example.

FIG. 2 illustrates a bifacial semiconductor wafer 200 having semiconductor dies on opposing planar surfaces according to an example. The bifacial semiconductor wafer 200 may be used in a memory device such as, for example, a 3D NAND memory device. Although a 3D NAND memory device is specifically mentioned, the bifacial semiconductor wafer 200 may be used in various other semiconductor devices.

As shown in FIG. 2, the bifacial semiconductor wafer 200 includes a base layer 210. The base layer 210 may be comprised of silicon such as, for example, silicon carbon nitride (SiCN) and/or silicon dioxide (SiO$_2$). The base layer 210 includes a first planar surface 220 and a second planar surface 230 opposite the first planar surface 220.

A first circuit layer 240 is fabricated or otherwise provided on the first planar surface 220. In examples, the first circuit layer 240 is fabricated on the first planar surface using a traditional fabrication process. The fabrication process may include one or more layering processes, one or more patterning processes, one or more doping processes, one or more heating treatment processes, one or more wafer cleaning processes and/or one or more wafer smoothing processes. As shown in FIG. 2, the first planar surface 220 may include multiple circuit layers or an array of semiconductor dies. In an example, the semiconductor dies may be memory dies.

In examples, the first circuit layer 240 includes or is otherwise associated with a redistribution layer 250. The redistribution layer 250 electrically connects each semiconductor die on the first planar surface 220 to other semiconductor dies on the first planar surface 220.

The bifacial semiconductor wafer 200 also includes a second circuit layer 260. The second circuit layer 260 is fabricated or is otherwise provided on the second planar surface 230. In examples, the second circuit layer 260 is fabricated in a similar manner as the first circuit layer 240. For example, the first circuit layer may be fabricated on first silicon wafer and the second circuit layer may be fabricated on second silicon wafer and the first silicon wafer may be bonded to the second silicon wafer such as will be described in greater detail with respect to FIG. 7. As shown in FIG. 2, the second planar surface 240 may include multiple circuit layers (e.g., second circuit layer 260) or an array of semiconductor dies. In an example, the semiconductor dies may be memory dies.

Like the first circuit layer 240, the second circuit layer 260 may include or otherwise be associated with a redistribution layer 270. The redistribution layer 270 electrically connects each semiconductor die on the second planar surface 230 to other semiconductor dies on the second planar surface 230.

In an example, the bifacial semiconductor wafer 200 may also include one or more through silicon vias 280. The through silicon vias 280 may extend from the first circuit layer 240, through the base layer 210, to the second circuit layer 260. As such, the through silicon vias 280 electrically couple the first circuit layer 240, or first face, of the bifacial semiconductor wafer 200 to the second circuit layer 260, or second face, of the bifacial semiconductor wafer 200. Although the through silicon vias 280 are shown in a circular pattern, the through silicon vias 280 may be arranged in any suitable manner.

Figure 3:
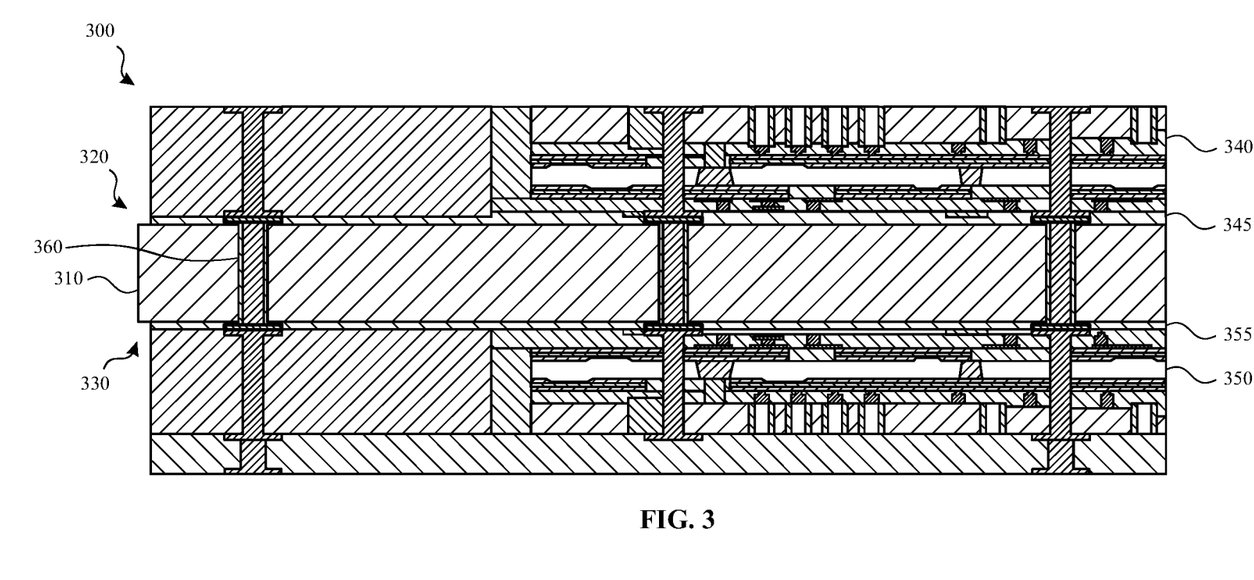
FIG. 3 illustrates a cross-section view of a bifacial semiconductor wafer according to an example.

FIG. 3 illustrates a cross-section view of a bifacial semiconductor wafer 300 according to an example. The bifacial semiconductor wafer 300 may be similar to the bifacial semiconductor wafer 200 shown and described with respect to FIG. 2.

For example, the bifacial semiconductor wafer 300 includes a base layer 310. The base layer 310 includes a first planar surface 320 and a second planar surface 330 opposite the first planar surface 320. A first circuit layer 340 is fabricated on the first planar surface 320 and a second circuit layer 350 is fabricated on the second planar surface 330.

As indicated above, each of the first circuit layer 340 and the second circuit layer 350 may include a redistribution layer that enables signal transmission between the various semiconductor dies that are provided on the first planar surface 320 and the second planar surface 330. For example, a first redistribution layer 345 is provided on the first planar surface 320 to enable signal transmissions between the various semiconductor dies on the first planar surface 330. Likewise, a second redistribution layer 355 is provided on the second planar surface 330 to enable signal transmissions between the various semiconductor dies on the second planar surface 330.

The bifacial semiconductor wafer 300 also includes one or more through silicon vias 360. Each through silicon via 360 extends through the base layer 310 and enables signal transmission between the first circuit layer 340 and the second circuit layer 350.

Figure 4:
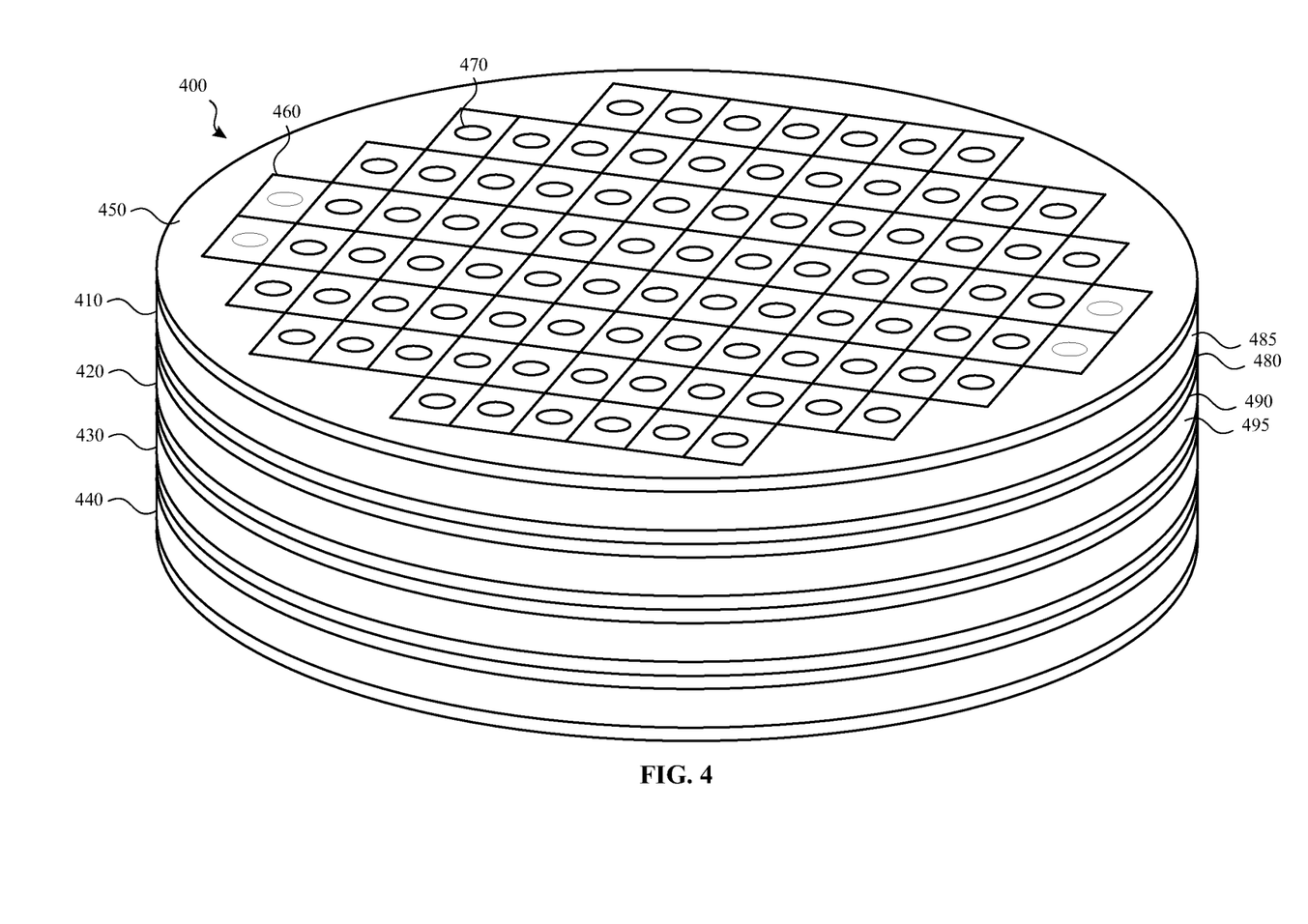
FIG. 4 illustrates a semiconductor device in which multiple bifacial semiconductor wafers have been stacked on top of one another according to an example.

FIG. 4 illustrates a semiconductor device 400 in which multiple bifacial semiconductor wafers (e.g., bifacial semiconductor wafer 410, bifacial semiconductor wafer 420, bifacial semiconductor wafer 430, and bifacial semiconductor wafer 440), have been stacked on top of one another according to an example. In the example shown, the semiconductor device 400 may be a memory device or a data storage device. When compared with a typical memory device in which traditional semiconductor wafers are used (e.g., semiconductor wafer 100 (FIG. 1)), the semiconductor device 400 shown in FIG. 4 can store double the amount of data while consuming the same or a similar amount of space. In the example shown in FIG. 4, each bifacial semiconductor wafer in the semiconductor device 400 may be similar to the bifacial semiconductor wafer 200 shown and described with respect to FIG. 2.

For example, bifacial semiconductor wafer 410 may include a first planar surface 450, of face. The first planar surface 450 may include an array or a series of semiconductor dies 460. In examples, the plurality of semiconductor dies 460 are NAND memory dies although other semiconductor dies may be used. In examples, the first planar surface 450 also includes a redistribution layer such as described above to enable signal transmission between each semiconductor die in the array of semiconductor dies 460.

The bifacial semiconductor wafer 410 may also include a second planar surface 480, or face, opposite the first planar surface 450. The second planar surface 480 also includes an array or a series of semiconductor dies and a redistribution layer such as previously described. As shown in FIG. 4, one or more through silicon vias 470 enable signal transmission between the array of semiconductor dies 460 on the first planar surface 450 and the array of semiconductor dies on the second planar surface 480 of the first bifacial semiconductor wafer 410. The same is also true for the other bifacial semiconductor wafers (e.g., bifacial semiconductor wafer 420, bifacial semiconductor wafer 430, and bifacial semiconductor wafer 440) in the semiconductor device 400.

When multiple bifacial semiconductor wafers are stacked together such as shown in FIG. 4, a second planar surface (and/or one or more semiconductor dies on the second planar surface) of one bifacial semiconductor wafer is electrically coupled to a first planar surface (and/or one or more semiconductor dies on the first planar surface) of another bifacial semiconductor wafer. For example, the second planar surface 480 of the first bifacial semiconductor wafer 410 may be electrically coupled to a first planar surface 490 of the second bifacial semiconductor wafer 420.

Although FIG. 4 shows four bifacial semiconductor wafers being stacked together, the semiconductor device 400 may include any number of stacked bifacial semiconductor wafers without suffering from the various drawbacks of using conventional semiconductor wafers such as described above. For example, the planar surfaces of each bifacial semiconductor wafer may be electrically coupled using a wafer to wafer bonding process. The wafer to wafer bonding process may be used to transmit signals between each of the bifacial semiconductor wafers thereby eliminating the need for wire bonding different layers of the semiconductor device 400.

In an example, the wafer to wafer bonding process may be a copper to copper bonding process in which a high temperature annealing process may be used to bond copper fingers or pillars from adjacent faces or surfaces of bifacial semiconductor wafers together. In another example, solder bumps may be used to electrically couple or otherwise bond adjacent surfaces or faces of the bifacial semiconductor wafers to each other.

Bonding such as described above enables higher signal transmission between the bifacial semiconductor wafers when compared to traditional bond wires. Accordingly, cost savings in terms of materials and/or time may be achieved by stacking bifacial semiconductor wafers in the manner described herein when compared to traditional wafer stacking.

In an example, an outside edge or surface (or an entire diameter) of a bifacial semiconductor wafer may be flush, aligned or substantially aligned with each outside edge or surface of the other bifacial semiconductor wafers in the semiconductor device 400. For example and as shown in FIG. 4, the outside edge 485 of the first bifacial semiconductor wafer 410 is substantially aligned or flush with respect to the outside edge 495 of the second bifacial semiconductor wafer 495. This arrangement is made possible by utilizing a wafer to wafer bonding process instead of bond wires such as previously described.

As discussed above, in typical stacked semiconductor devices (e.g., traditional 3D NAND memory devices) the number of layers may be limited by an amount of stress that is induced on the semiconductor wafers when a circuit layer is fabricated on a single surface. As the number of wafers increases, the amount of stress also increases which can subsequently warp the semiconductor wafers in the semiconductor device.

However, the bifacial semiconductor wafers described herein reduce the risk of wafer warpage as an amount of stress provided on the first planar surface of a semiconductor wafer by the first circuit layer is offset by an amount of stress provided on the second planar surface of the semiconductor wafer by the second circuit layer. Accordingly, any number of bifacial semiconductor wafers may be stacked on top of one another while eliminating or substantially reducing the risk of the semiconductor wafers warping. As such, the bifacial semiconductor wafer described may be used for extra large packaging capacity as n or more bifacial semiconductor wafers may be stacked.

Figure 5:
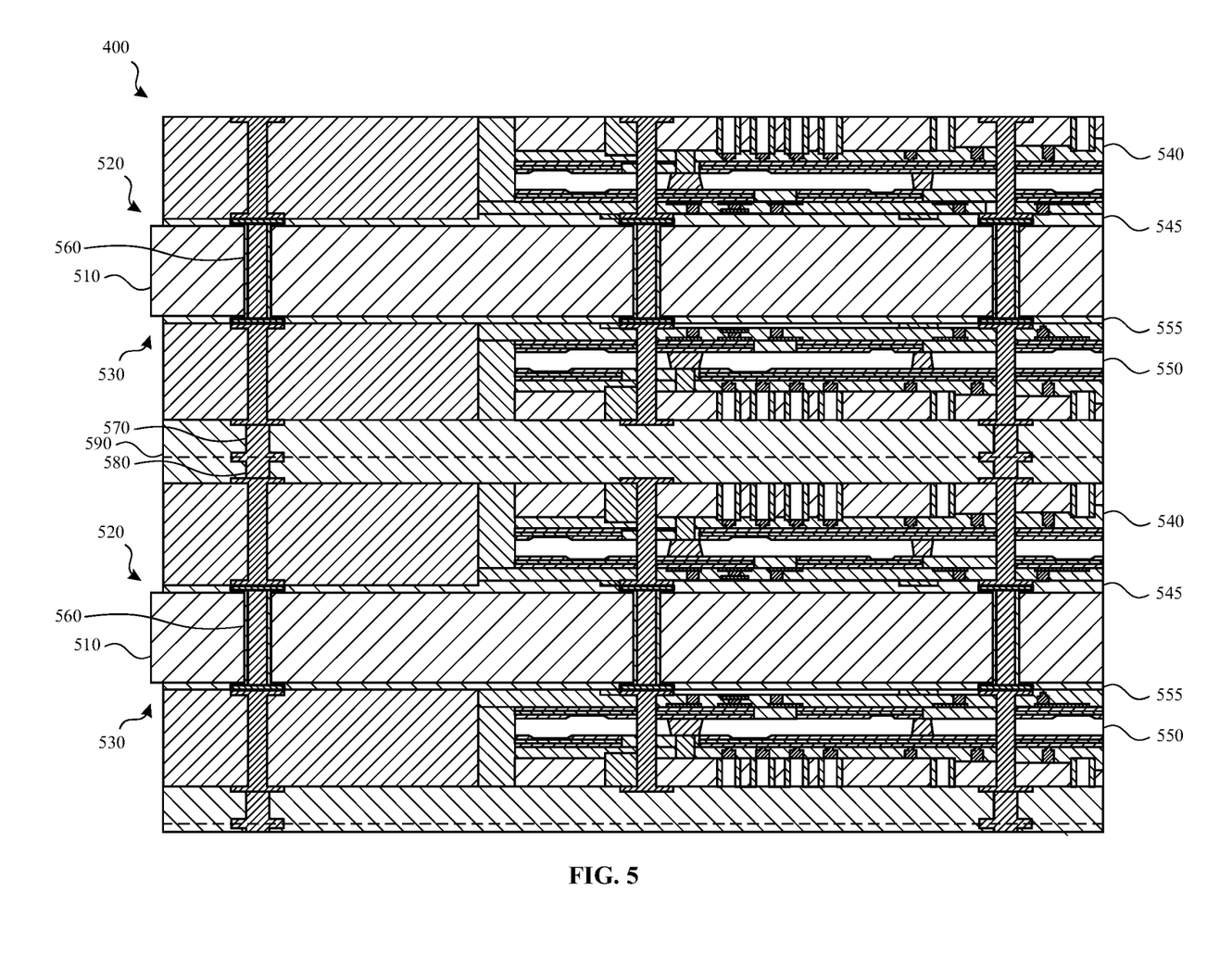
FIG. 5 illustrates a partial cross-section view of the semiconductor device of FIG. 4 according to an example.

FIG. 5 illustrates a partial cross-section view of the semiconductor device 400 of FIG. 4 according to an example. The partial cross-section view of FIG. 5 shows two different bifacial semiconductor wafers (e.g., bifacial semiconductor wafer 410 and bifacial semiconductor wafer 420 (FIG. 4)) that are electrically coupled or otherwise bonded together. As with the other bifacial semiconductor wafers shown and described herein, each bifacial semiconductor wafer includes a base layer 510. The base layer 510 includes a first planar surface 520 and a second planar surface 530 opposite the first planar surface 520. A first circuit layer 540 is fabricated on the first planar surface 520 and a second circuit layer 550 is fabricated on the second planar surface 530.

As indicated above, each of the first circuit layer 540 and the second circuit layer 550 may include a redistribution layer (e.g., redistribution layer 545 and redistribution layer 555) that enables signal transmission between the various semiconductor dies that are included on the first planar surface 520 and the second planar surface 530. Each bifacial semiconductor wafer also includes one or more through silicon vias 560 that enable signal transmission between the first circuit layer 540 and the second circuit layer 550.

As also discussed above, each bifacial semiconductor wafer is electrically coupled or otherwise bonded together. For example, one or more copper bumps 570 or pillars may be provided on or otherwise associated the second planar surface 530 of one bifacial semiconductor wafer while one or more copper bumps 580 or pillars may be provided on or otherwise associated the first planar surface 520 of another bifacial semiconductor wafer. A high temperature annealing process may be used to bond the copper bump 570 with the copper bump 580. A bonding force between copper bump 570 and copper bump 580 created by the high temperature may enable the bifacial semiconductor wafer stacking to be completed or substantially completed during fabrication. Accordingly, extra manufacturing steps of wafer attaching and wire bonding may not be needed.

In some examples and as shown in FIG. 5, a layer of silicon 590 or a silicon mixture (e.g., silicon dioxide or carbon nitride) or another substrate may be positioned on or otherwise associated with the various planar surfaces and/or circuit layers. For example, a layer of silicon 590 may be provided on an outside/bottom surface of the second circuit layer 550 of one bifacial semiconductor wafer while another layer of silicon 590 may be provided on an outside/top surface of the first circuit layer 540 of another bifacial semiconductor wafer on which the first bifacial semiconductor wafer is stacked. The copper bump 570 or pillar may be provided on or otherwise extend through the layer of silicon 590 to enable signal transmission between the bifacial semiconductor wafers.

Although copper bumps 570 or pillars are specifically mentioned, solder bumps, solder balls and/or other bonding processes may be used to electrically coupled the bifacial semiconductor wafers.

Figure 6:
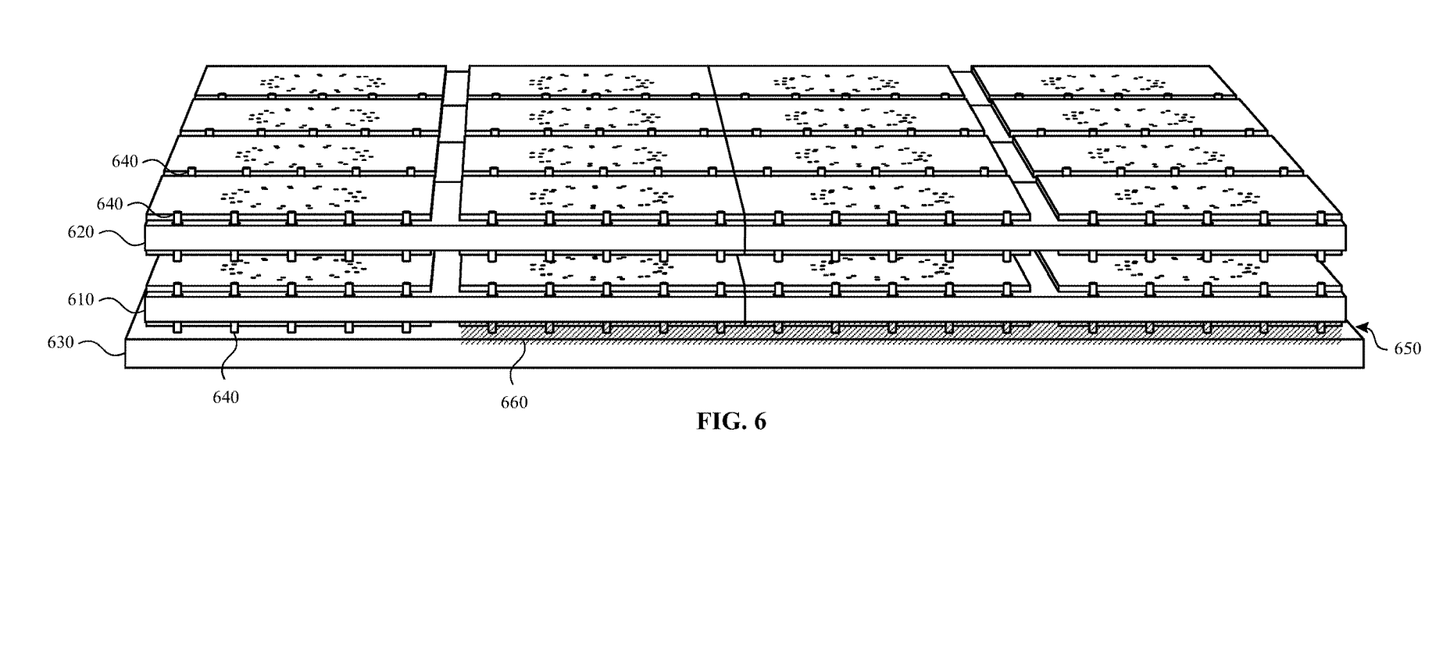
FIG. 6 illustrates an example in which multiple bifacial semiconductor wafers are stacked and electrically coupled according to an example.

FIG. 6 illustrates how a first bifacial semiconductor wafer 610 and a second bifacial semiconductor wafer 620 are electrically coupled or bonded according to an example. FIG. 6 also illustrates how the first bifacial semiconductor wafer 610 and a second bifacial semiconductor wafer 620 are electrically coupled or otherwise bonded to a substrate 630.

In the example shown in FIG. 6, the first bifacial semiconductor wafer 610 and the second bifacial semiconductor wafer 620 are electrically coupled or are otherwise bonded together using solder bumps 640 or solder balls. Unlike the copper to copper bonding process described above in which high temperature annealing is used, the bonding process shown and described with respect to FIG. 6 may be done at room temperature.

In order to bond the first bifacial semiconductor wafer 610 and the second bifacial semiconductor wafer 620, solder bumps 640 bonded or are otherwise provided on each surface (e.g., a base layer, a first circuit layer, a second circuit layer) of the first bifacial semiconductor wafer 610. The first bifacial semiconductor wafer 610 may then be bonded to the substrate 630. In an example, the solder bumps

640 may be used for signal transmission between the first bifacial semiconductor wafer 610 and the substrate 630.

The second bifacial semiconductor wafer 620 is added to the first bifacial semiconductor wafer 610 in a similar manner. For example, solder bumps 640 bonded or are otherwise provided on each surface (e.g., a base layer, a first circuit layer, a second circuit layer) of the second bifacial semiconductor wafer 620. The second bifacial semiconductor wafer 610 may then be bonded to the first bifacial semiconductor wafer 610. In an example, the solder bumps 640 may be used for signal transmission between the first bifacial semiconductor wafer 610 and the second bifacial semiconductor wafer 620. This process may be repeated for each additional bifacial semiconductor wafer that is added to the stack.

In an example, a gap 650 may be present between each bifacial semiconductor wafer and/or the substrate 630. In such cases, a molding compound (represented by the shaded box 660) may be used to fill in the gaps 650. Although the shaded box 660 is shown as partially covering the stack of bifacial semiconductor wafers, the molding compound may extend substantially around or completely around the entire structure shown in FIG. 6.

Figure 7:
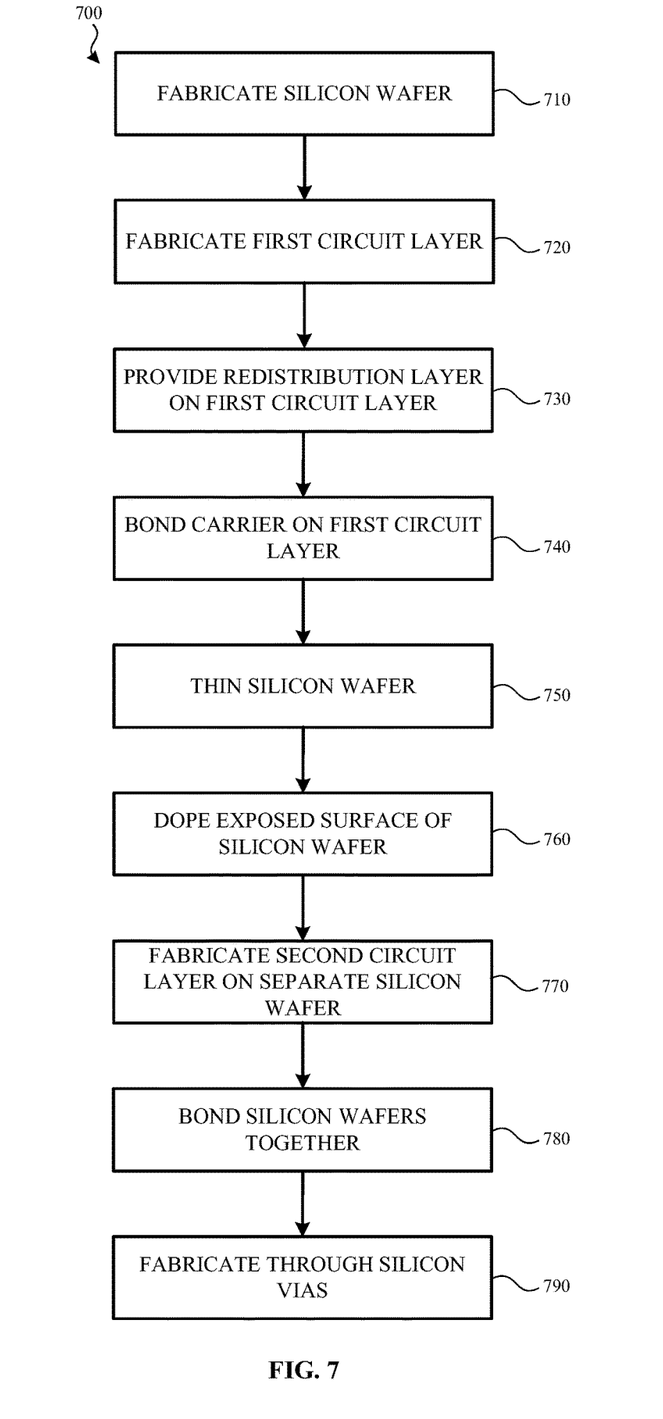
FIG. 7 illustrates a method for fabricating a bifacial semiconductor wafer according to an example.

FIG. 7 illustrates a method 700 for fabricating a bifacial semiconductor wafer according to an example. The method 700 may be used to fabricate the various bifacial semiconductor wafers described herein.

Method 700 begins when a silicon wafer is fabricated (710). In an example, the silicon wafer may be fabricated by any available or known fabrication process. Once the silicon wafer is fabricated, a first circuit layer is fabricated (720) on a planar surface of the silicon wafer. In an example, the first circuit layer is fabricated using a traditional fabrication process such as described above. As discussed above, although a first circuit layer is described, it should be understood that the fabrication process may be used to create a series or an array of semiconductor dies on the planar surface of the silicon wafer. As part of a fabrication process, a redistribution layer is added (730) to or otherwise associated with the first circuit layer/array of semiconductor dies.

A carrier is then bonded (740) to the face of the first circuit layer to protect and support the first circuit layer. In an example, the carrier may be an adhesive material. A thinning process (750) is then performed on the exposed surface of the silicon wafer. In an example, the silicon wafer may be thinned to approximately 100 um (although other dimensions may be used). In examples, traditional thinning and/or grinding processes may be used.

Once the silicon wafer has been thinned, a doping process (760) is performed to add a doping layer on the exposed surface of the silicon wafer. The doping layer will act as a barrier between the first circuit layer and the second circuit layer (e.g., when the second circuit layer is combined with the first circuit layer such as will be described in greater detail below).

Once operations 710-760 have been performed for the first circuit layer, these operations are repeated to fabricate (770) a second circuit layer on a second, different silicon wafer. Once the second circuit layer has been fabricated, the first silicon wafer and the second silicon wafer are bonded (780) together. In an example, this bonding process may be a high temperature annealing process. In an example, when bonding the first silicon wafer and the second silicon wafer, the doping layers on the first silicon wafer is face to face with the doping layer on the second silicon wafer. As described above, the doping layers prevent crosstalk between the first circuit layer and the second circuit layer.

Once the wafers have been bonded, the carrier on the second circuit layer may be removed and through silicon vias may be fabricated (790) to enable the first circuit layer and the second circuit layer to communicate.

In some examples, a wafer (e.g., a CBA wafer) may have thermal limitations for a cell layer and a CMOS layer. For example, the CMOS layer is very sensitive to a high temperature annealing process. During fabrication, an array layer typically goes through many annealing processes. As such, when fabricating a wafer with thermal limitations, an array wafer may be prepared separately from the CMOS layer and the two layers are bonded together at the end so as to avoid subjecting the CMOS layer to the annealing process.

For example, a bifacial CMOS wafer may be fabricated in a similar manner such as described above with respect to FIG. 7. For example, the wafer may be fabricated using some or all of operations 710-780. However, as an additional operation, two array wafers may be bonded on top of the two different CMOS circuit faces. Once the array wafers have been bonded, through silicon vias may be fabricated between the two circuit faces. In examples, the through silicon via fabrication process may be done at the same time (e.g., etching from the top face/surface to the bottom face/surface) or done N times for each circuit layer.

Figure 8A:
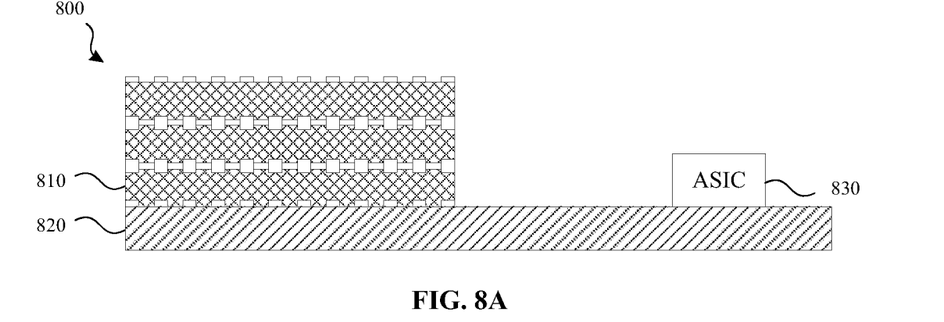
FIG. 8A-FIG. 8C illustrates various applications for a bifacial semiconductor wafer such as described herein according to various examples.
Figure 8B:
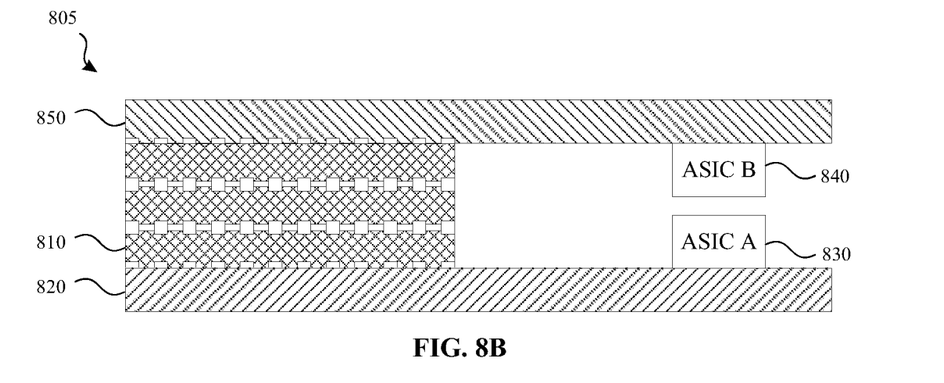
Figure 8C:
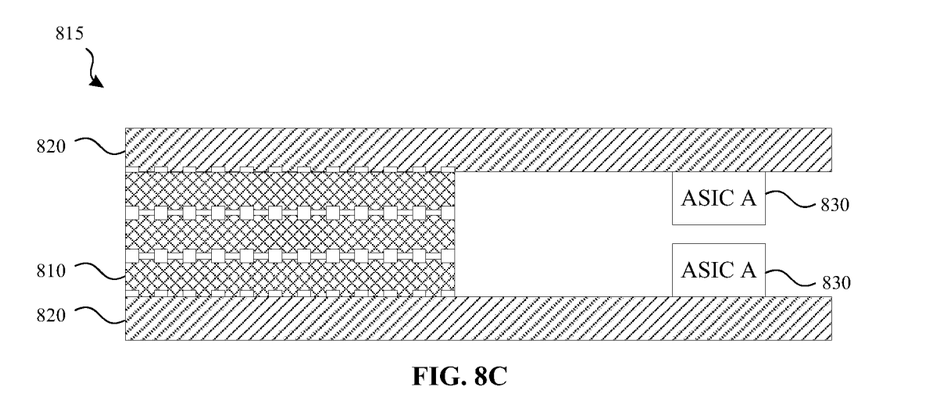

FIG. 8A-FIG. 8C illustrates various applications for a bifacial semiconductor wafer such as described herein according to various examples. For example FIG. 8A illustrates a high capacity storage device 800 in which multiple bifacial semiconductor wafers 810 are stacked on a substrate 820. In an example, an application-specific integrated circuit (ASIC) 830 may also be coupled to the substrate 800 to control the various functions of the high capacity storage device 800.

FIG. 8B illustrates a multi-function, dual face high capacity storage device 805 according to an example. In this example, a first substrate 820 and an associated application-specific integrated circuit (ASIC A) 830 are attached to a planar surface of the bifacial semiconductor wafer 810 while a second substrate 850 is attached to a planar surface of another bifacial semiconductor wafer 810. The second substrate may be associated with a second application-specific integrated circuit (ASIC B) 840. The second substrate 850 and the second integrated circuit 840 may be different than the first substrate 820 and/or the first integrated circuit 830. For example, the two different substrates and their associated application-specific integrated circuits may be used to facilitate different writes and/or reads on the different sides of the high capacity storage device 805. For example, ASIC A 820 may control reads and/or writes at a first speed while ASIC B 840 controls reads and/or writes at a second, different speed.

FIG. 8C illustrates a dual face, high speed, high capacity storage device 815 according to an example. In this example, the same or a similar substrate (e.g., substrate 820) and similar application-specific integrated circuits (ASIC A) 830 are attached to two different bifacial semiconductor wafers 810. In this example, the substrates and their associated application-specific integrated circuits may be used to facilitate writes and/or reads on the different sides of the high capacity storage device 815 at the same or similar speeds thereby providing two times data transmission speeds when compared to the data transmission speeds of the high capacity storage device 800.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A semiconductor device, comprising:
   a bifacial semiconductor wafer having a first planar surface and a second planar surface opposite the first planar surface;
   a first plurality of semiconductor dies fabricated onto the first planar surface;
   a second plurality of semiconductor dies fabricated onto the second planar surface; and
   a plurality of through silicon vias electrically coupling the first plurality of semiconductor dies on the first planar surface with the second plurality of semiconductor dies on the second planar surface.

2. The semiconductor device of claim 1, further comprising a first redistribution layer associated with the first plurality of semiconductor dies, the first redistribution layer enabling communication between the first plurality of semiconductor dies.

3. The semiconductor device of claim 1, further comprising a second redistribution layer associated with the second plurality of semiconductor dies, the second redistribution layer enabling communication between the second plurality of semiconductor dies.

4. The semiconductor device of claim 1, wherein the bifacial semiconductor wafer is a first bifacial semiconductor wafer and wherein the semiconductor device further comprises:
   a second bifacial semiconductor wafer having a first planar surface and a second planar surface opposite the first planar surface;
   a first plurality of semiconductor dies fabricated onto the first planar surface;
   a second plurality of semiconductor dies fabricated onto the second planar surface; and
   a plurality of through silicon vias electrically coupling the first plurality of semiconductor dies on the first planar surface with the second plurality of semiconductor dies on the second planar surface.

5. The semiconductor device of claim 4, wherein the first bifacial semiconductor wafer is electrically coupled to the second bifacial semiconductor wafer.

6. The semiconductor device of claim 5, wherein the first bifacial semiconductor wafer is electrically coupled to the second bifacial semiconductor wafer via a copper to copper bond between the first bifacial semiconductor wafer and the second bifacial semiconductor wafer.

7. The semiconductor device of claim 5, wherein the first bifacial semiconductor wafer is electrically coupled to the second bifacial semiconductor wafer via one or more solder bumps.

8. The semiconductor device of claim 5, further comprising a molding compound disposed between a gap that is formed between the first bifacial semiconductor wafer and the second bifacial semiconductor wafer when the first bifacial semiconductor wafer and the second bifacial semiconductor wafer are electrically coupled.

9. The semiconductor device of claim 1, wherein the second planar surface is electrically coupled to a substrate.

10. A semiconductor device, comprising:
    a first bifacial semiconductor wafer having a first circuit layer fabricated onto a first planar surface and a second circuit layer fabricated onto a second planar surface opposite the first planar surface, the first circuit layer being electrically coupled to the second circuit layer; and
    a second bifacial semiconductor wafer electrically coupled to the first bifacial semiconductor wafer, the second bifacial semiconductor wafer having a first circuit layer fabricated onto a first planar surface and a second circuit layer fabricated onto a second planar surface opposite the first planar surface, the first circuit layer of the second bifacial semiconductor wafer being electrically coupled to the second circuit layer of the first bifacial semiconductor wafer.

11. The semiconductor device of claim 10, further comprising a first redistribution layer associated with the first circuit layer and a second redistribution layer associated with the second circuit layer on the first bifacial semiconductor wafer.

12. The semiconductor device of claim 10, further comprising one or more through silicon vias for electrically coupling the first circuit layer on the first bifacial semiconductor wafer with the second circuit layer on the first bifacial semiconductor wafer.

13. The semiconductor device of claim 10, wherein the first bifacial semiconductor wafer is electrically coupled to the second bifacial semiconductor wafer using a copper to copper bond.

14. The semiconductor device of claim 10, further comprising a substrate electrically coupled to the second circuit layer of the second bifacial semiconductor wafer.

15. The semiconductor device of claim 10, wherein an outer edge of the first bifacial semiconductor wafer is substantially aligned with an outer edge of the second bifacial semiconductor wafer.

* * * * *